(12) United States Patent
Huang et al.

(10) Patent No.: US 9,883,590 B2
(45) Date of Patent: Jan. 30, 2018

(54) SHIELDING STRUCTURE FOR INTEGRATED INDUCTOR/TRANSFORMER

(71) Applicant: REALTEK SEMICONDUCTOR CORP., Hsinchu (TW)

(72) Inventors: Kai-Yi Huang, Taipei (TW); Hsiao-Tsung Yen, Hsinchu (TW); Tai-Sheng Chen, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/253,962

(22) Filed: Sep. 1, 2016

(65) Prior Publication Data
US 2017/0076857 A1    Mar. 16, 2017

(30) Foreign Application Priority Data
Sep. 14, 2015 (TW) .............................. 104130278 A (51) Int. Cl.
*H05K 9/00* (2006.01)
*H05K 1/11* (2006.01)
(Continued)

(52) U.S. Cl.
CPC .......... *H05K 1/115* (2013.01); *H01F 27/362* (2013.01); *H05K 1/0218* (2013.01); *H05K 9/0064* (2013.01); *H01F 2027/348* (2013.01)

(58) Field of Classification Search
CPC .. H05K 9/0039; H05K 9/0064; H05K 1/0224; H01F 27/362
See application file for complete search history.

(56) References Cited

U.S. PATENT DOCUMENTS

| | | | | | |
|---|---|---|---|---|---|
| 5,455,116 | A | * | 10/1995 | Nagano | ................... G21F 1/125 174/393 |
| 5,455,117 | A | * | 10/1995 | Nagano | ................... G21F 1/125 174/393 |

(Continued)

FOREIGN PATENT DOCUMENTS

WO    WO 98/50958 A1    11/1998

OTHER PUBLICATIONS

C. Patric Yue, et al., "On-Chip Sprial Inductors with Patterned Ground Shields for Si-Based RF IC's", http://holst.stanford.edu/~CPYue.

*Primary Examiner* — Hung V Ngo
(74) *Attorney, Agent, or Firm* — Li&Cai Intellectual Property (USA) Office (57) ABSTRACT

Disclosed is a shielding structure for an integrated inductor/transformer, configured under the integrated inductor or the transformer and upon a substrate. The shielding structure includes conductive units, first connecting portions, via holes, a second connecting portion and a grounding portion. Each conductive unit includes a first conductive portion and second conductive portions extending from the first conductive portion. The number of the second conductive portions is odd. The length of each second conductive portion progressively diminishes from a center of the first conductive portion to both of two ends of the first conductive portion. The first connecting portion connects the first conductive portions of the conductive units through via holes. The grounding portion is connected to one of the first conductive portions. The second connecting portion connects all longest second conductive portions together. Moreover, the conductive units and the second connecting portion are made of different conductive materials.

10 Claims, 10 Drawing Sheets

(51) Int. Cl.
*H05K 1/02* (2006.01)
*H01F 27/36* (2006.01)
*H01F 27/34* (2006.01)

(56) References Cited

U.S. PATENT DOCUMENTS

| | | | |
|---|---|---|---|
| 5,682,124 A * | 10/1997 | Suski | H01P 3/081 |
| | | | 174/254 |
| 6,441,392 B1 | 8/2002 | Gautier et al. | |
| 6,593,838 B2 | 7/2003 | Yue | |
| 7,084,728 B2 | 8/2006 | Hyvonen | |
| 8,559,186 B2 | 10/2013 | Jin | |
| 2005/0016746 A1* | 1/2005 | Sze | H05K 1/0227 |
| | | | 174/396 |
| 2005/0029919 A1* | 2/2005 | Notohara | H05K 9/009 |
| | | | 313/326 |
| 2008/0029854 A1 | 2/2008 | Hung et al. | |
| 2009/0147428 A1* | 6/2009 | Kwon | H05K 5/0021 |
| | | | 361/212 |
| 2012/0292693 A1 | 11/2012 | Lee et al. | |
| 2015/0107891 A1* | 4/2015 | Haynes | H01F 27/362 |
| | | | 174/359 |

\* cited by examiner

SHIELDING STRUCTURE FOR INTEGRATED INDUCTOR/TRANSFORMER

BACKGROUND OF THE INVENTION

1. Field of the Invention

The present disclosure relates to a shielding structure; in particular, to a shielding structure for integrated inductors/transformers.

2. Description of Related Art

Generally, integrated inductors or transformers are configured on a silicon substrate, so when the entire integrated circuit is working the silicon substrate may be coupled with a generated electromagnetic energy, which causes substrate losses and makes the Q factor (the Quality factor, which is the ratio of the power storage and the power consumption) drop. Under two ideal circumstances, substrate losses can almost be prevented. In one, the silicon substrate has an infinitely great resistance, and in the other, the silicon substrate has barely resistance. However, the resistance of the silicon substrate is commonly 10~15 Ohm-Cm. In this case, when the inductor or the transformer is working at a high frequency, there will be a coupling current generated causing substrate losses when the current flows through the silicon substrate.

Currently, the lower metal layer or the poly-silicon is used to form a shielding structure for integrated inductors or transformers to prevent the silicon substrate from being coupled with the electromagnetic energy. However, the solid shielding structure may cause a large Eddy current effect. In this case, a reverse magnetic field is generated when the current is flowing through the shielding structure and thus the integrated inductors or transformers may be damaged.

SUMMARY OF THE INVENTION

The present disclosure provides a shielding structure for integrated inductors/transformers. The shielding structure is used in an integrated inductor or a transformer, and specifically is configured under the integrated inductor or the transformer and upon a substrate. The shielding structure comprises a plurality of conductive units, a plurality of first connecting portions and a grounding portion. The conductive units comprise a first conductive unit, a second conductive unit, a third conductive unit and a fourth conductive unit. Each conductive unit comprises a first conductive sub-unit and a second conductive sub-unit, and both of the first conductive sub-unit and the second conductive sub-unit comprise a first conductive portion and a plurality of second conductive portions. The number of the second conductive portions is odd. The length of each second conductive portion progressively diminishes along the first conductive portion. In addition, the longest second conductive portion of the first conductive sub-unit and the longest second conductive portion of the second conductive sub-unit are connected. One of the first connecting portions connects the first conductive unit and the second conductive unit, and another one of the first connecting portions connects the third conductive unit and the fourth conductive unit. The first conductive portion of the first conductive sub-unit of the first conductive unit is connected to the first conductive portion of the second conductive sub-unit of the fourth conductive unit, and the grounding portion is connected to where these two first conductive portions are connected. Alternatively, the first conductive portion of the second conductive sub-unit of the second conductive unit is connected to the first conductive portion of the first conductive sub-unit of the third conductive unit, and the grounding portion is connected to where these two first conductive portions are connected.

The present disclosure further provides a shielding structure for integrated inductors/transformers. The shielding structure is used in an integrated inductor or a transformer, and specifically is configured under the integrated inductor or the transformer and upon a substrate. The shielding structure comprises a plurality of conductive units and a second conductive portion. Each conductive unit comprises a first conductive portion and a plurality of second conductive portions. The second conductive portions extend from the first conductive portion. The number of the second conductive portions is odd. The length of each second conductive portion progressively diminishes from a center of the first conductive portion to both of two ends of the first conductive portion. In addition, the longest second conductive portions of the conductive units are connected. The second conductive portion extends from where the longest second conductive portions of the conductive units are connected, and is further connected to a grounding portion.

The present disclosure further provides a shielding structure for integrated inductors/transformers. The shielding structure is used in an integrated inductor or a transformer, and specifically is configured under the integrated inductor or the transformer and upon a substrate. The shielding structure comprises a first shielding layer, a second shielding layer and a plurality of via holes. The second shielding layer and the first shielding layer are overlapped and connected through via holes to form the shielding structure. The first shielding layer comprises a first conductive portion and a plurality of second conductive portions. The second conductive portions extend radially from the first conductive portion of the first shielding layer. Moreover, the second conductive portions of the first shielding layer are parallel with each other. The second shielding layer comprises a first conductive portion and a plurality of second conductive portions. The second conductive portions extend inwardly from the first conductive portion of the second shielding layer. Moreover, the second conductive portions of the second shielding layer are parallel with each other. Additionally, each second conductive portion of the first shielding layer is perpendicular to the overlapped second conductive portions of second shielding layer.

To sum up, in the shielding structures for integrated inductors/transformers disclosed by the present disclosure, the surrounding of the shielding structure is not closed but has openings, and the center of the shielding structure is not hollow because the conductive units are connected at the center of the shielding structure. In this manner, the Eddy current effect can be reduced so as to prevent the reverse magnetic field formed by the induced current from damaging the integrated inductor/transformer. Thus, the characteristics of the integrated inductor/transformer can be effectively improved. In addition, the conductive units are connected through via holes. The resistance of via holes is large, such that the conductivity of the connected conductive units decreases, which reduces the current flowing among the conductive units and minimizes the Eddy current effect. Moreover, the resistances of via holes and the connecting portions can be finely tuned to optimize the characteristics of the shielding structure. Additionally, the multi-layer design of the shielding structure can effectively make the performance better.

For further understanding of the present disclosure, reference is made to the following detailed description illustrating the embodiments of the present disclosure. The description is only for illustrating the present disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which:

FIG. 1b shows a schematic diagram of a conductive unit of the shielding structure shown in FIG. 1a.

FIG. 2b shows a schematic diagram of a conductive unit of the shielding structure shown in FIG. 2a.

DETAILED DESCRIPTION OF PREFERRED EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings.

It will be understood that, although the terms first, second, third, and the like, may be used herein to describe various elements, but these elements should not be limited by these terms. These terms are only to distinguish one element, region or section from another element, region or section. Thus, a first element, region or section discussed below could be termed a second element, region or section without departing from the teachings of the present disclosure. As used herein, the term "and/or" includes any and all combinations of one or more of the associated listed items.

One Embodiment of the Shielding Structure

Figure 1A:
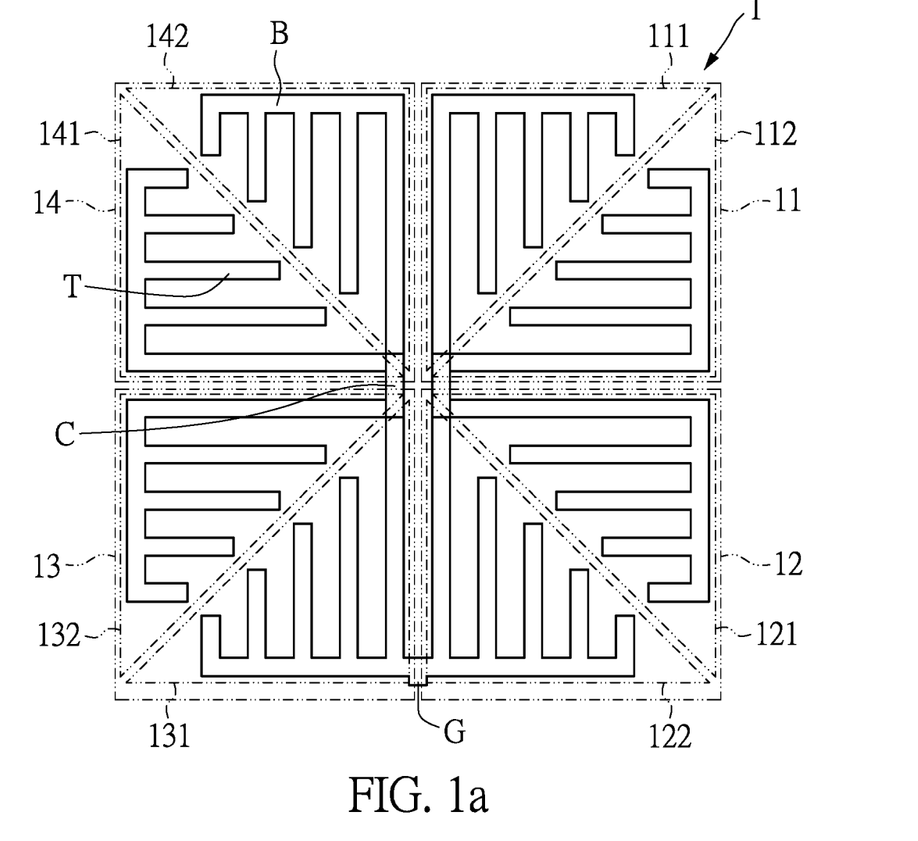
FIG. 1a shows a schematic diagram of a shielding structure for integrated inductors/transformers in one embodiment of the present disclosure.
Figure 1B:
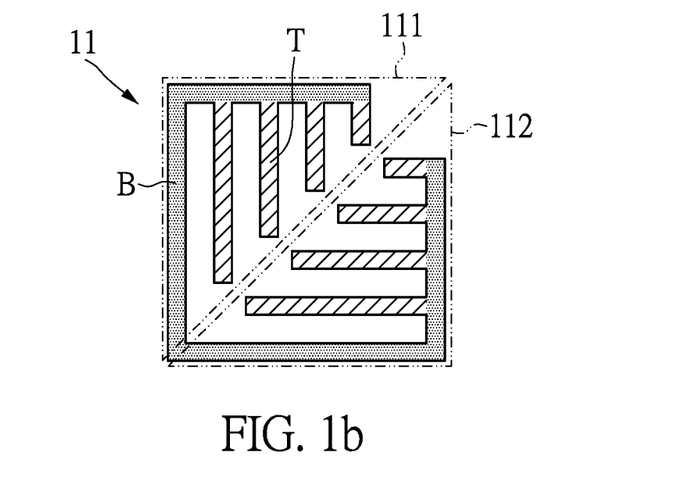

Referring to FIG. 1a and FIG. 1b, FIG. 1a shows a schematic diagram of a shielding structure for integrated inductors/transformers in one embodiment of the present disclosure, and FIG. 1b shows a schematic diagram of a conductive unit of the shielding structure shown in FIG. 1a.

As shown in FIG. 1a, the shielding structure 1 comprises a plurality of conductive units 11~14, a plurality of first connecting portions C and a grounding portion G. The conductive units 11~14 are respectively the first conductive unit 11, the second conductive unit 12, the third conductive unit 13 and the fourth conductive unit 14, and each of them comprises a first conductive sub-unit 111~141 and a second conductive sub-unit 112~142. One single conductive unit of the shielding structure 1 is shown in FIG. 1b, and it can be one of the conductive units 11~14 shown in FIG. 1a. Take the first conductive unit 11 for example, as shown in FIG. 1b, the first conductive unit 11 comprises the first conductive sub-unit 111 and the second conductive sub-unit 112. Both of the first conductive sub-unit 111 and the second conductive sub-unit 112 comprise a first conductive portion B and a plurality of second conductive portions T. Specifically speaking, the second conductive portions T extend from the first conductive portion B, and both of the first conductive sub-unit 111 and the second conductive sub-unit 112 are comb-shaped. The number of the second conductive portions T is odd. In addition, the lengths of the second conductive portions T progressively diminish along the first conductive portion B. In other words, the longest second conductive portion T extends from one end of the first conductive portion B, and the shortest second conductive portion T extends from the other end of the first conductive portion B. Moreover, the longest second conductive portion T of the first conductive sub-unit 111 is connected to the longest second conductive portion T of the second conductive sub-unit 112.

Again referring to FIG. 1a, one first connecting portion C connects the first conductive unit 11 and the second conductive unit 12, and another first connecting portion C connects the third conductive unit 13 and the fourth conductive unit 14. Additionally, the first conductive portion B of the first conductive sub-unit 111 of the first conductive unit 11 is connected to the first conductive portion B of the second conductive sub-unit 142 of the fourth conductive unit 14, and the grounding portion G is connected to where these two first conductive portions B are connected. Alternatively, the first conductive portion B of the second conductive sub-unit 122 of the second conductive unit 12 is connected to the first conductive portion B of the first conductive sub-unit 131 of the third conductive unit 13, and the grounding portion G is connected to where these two first conductive portions B are connected.

Figure 1C:
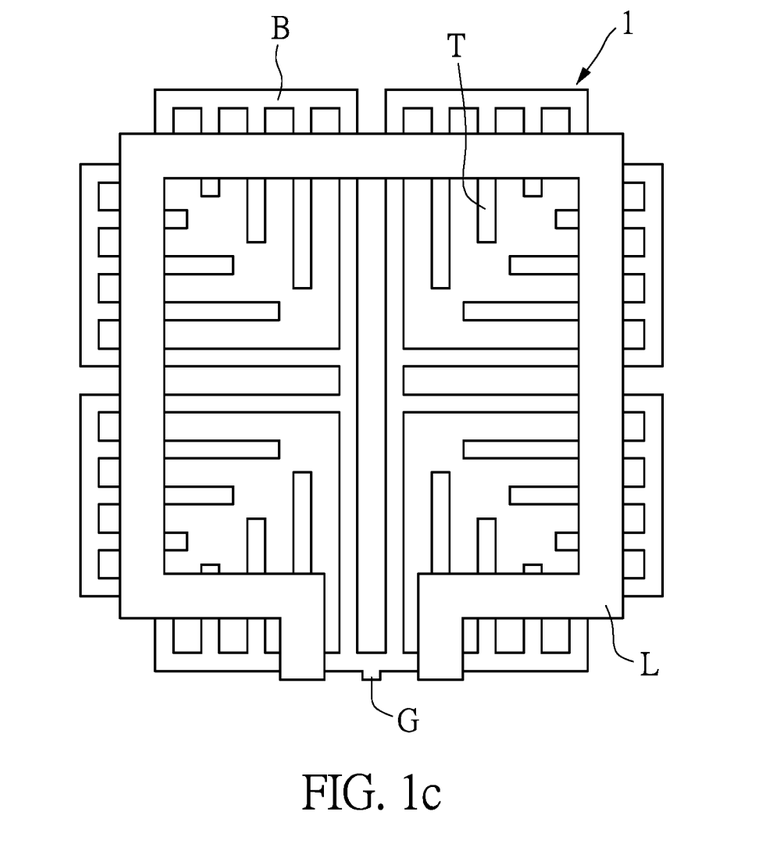
FIG. 1c shows a schematic diagram of the shielding structure shown in FIG. 1a which is used in an integrated inductor.

Referring to FIG. 1c, FIG. 1c shows a schematic diagram of the shielding structure shown in FIG. 1a which is used in an integrated inductor. It is worth mentioning that, the surrounding of the shielding structure 1 is not closed but has certain openings. Specifically speaking, except for the fact that the grounding portion G connects the first conductive portion B of the first conductive sub-unit 111 of the first conductive unit 11 and the first conductive portion B of the second conductive sub-unit 142 of the fourth conductive unit 14, the first conductive portion B of the first conductive unit 11 and the first conductive portion B of the second conductive unit 12 are not connected. In other words, there is an opening between these two first conductive portions B. Also, the first conductive portion B of the second conductive unit 12 and the first conductive portion B of the third conductive unit 13 are not connected, and the first conductive portion B of the third conductive unit 13 and the first conductive portion B of the fourth conductive unit 14 are not connected. In this manner, the Eddy current effect can be reduced so as to prevent the reverse magnetic field formed by the induced current from damaging the integrated inductor/transformer. In addition to the integrated inductor, the shielding structure 1 in this embodiment can be also used in a transformer having many coils, and it is not limited herein.

Figure 1D:
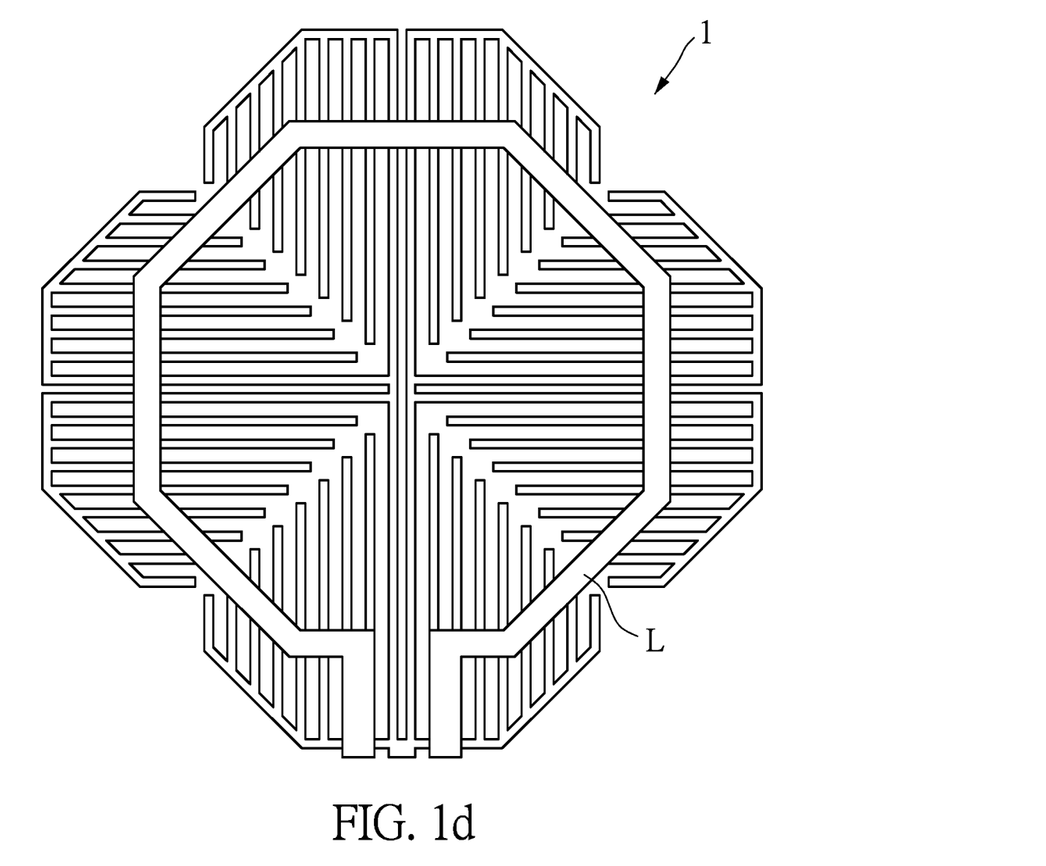
FIG. 1d shows a schematic diagram of the shielding structure shown in FIG. 1a which is a deformation and is used in an integrated inductor.

Referring to FIG. 1d, FIG. 1d shows a schematic diagram of the shielding structure shown in FIG. 1a which is a deformation and is used in an integrated inductor. The basic structures of the shielding structures 1 shown in FIG. 1a and FIG. 1d are similar but have a difference that, the shielding structure 1 shown in FIG. 1a is quadrangular, and the shielding structure 1 shown in FIG. 1d is octagonal, but the shape of the shielding structure 1 in this embodiment is not limited. However, it is worth mentioning that, the octagonal shielding structure 1 shown in FIG. 1d is a better fit for a transformer having many coils. That is, the octagonal shielding structure 1 can more effectively improve the characteristics of the transformer having many coils.

Figure 1E:
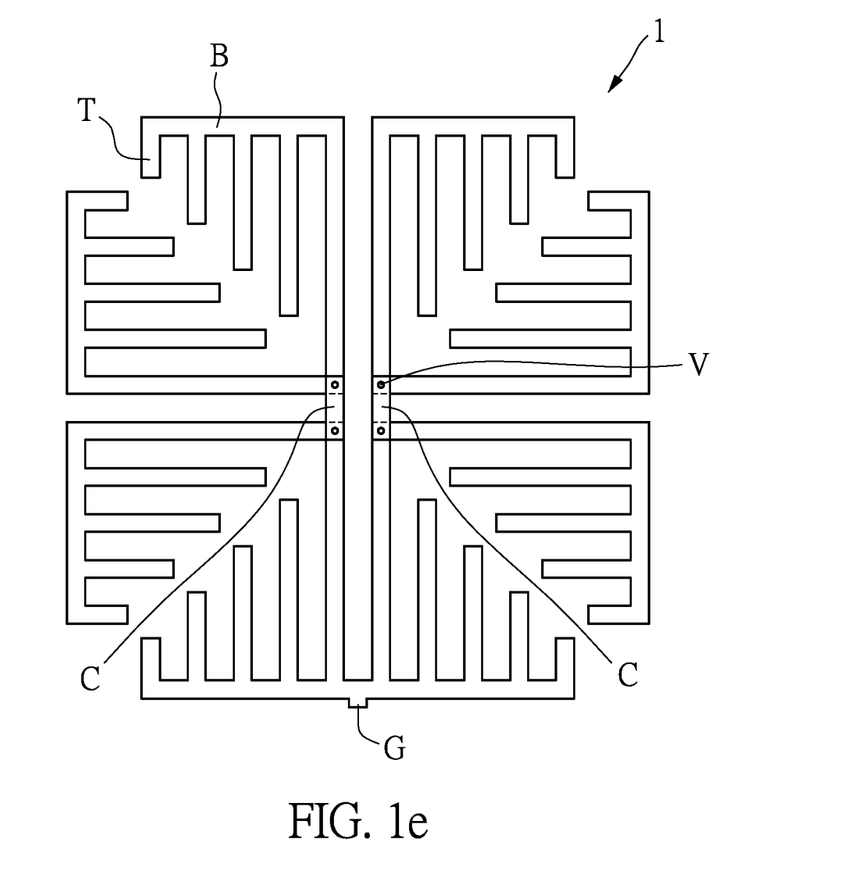
FIG. 1e shows a schematic diagram of a shielding structure for integrated inductors/transformers in another embodiment of the present disclosure.

Finally, referring to FIG. 1e, FIG. 1e shows a schematic diagram of a shielding structure for integrated inductors/transformers in another embodiment of the present disclosure. The basic structures of the shielding structures 1 shown in FIG. 1a and FIG. 1e are similar but have a difference that, there are a plurality of via holes in the shielding structure 1 shown in FIG. 1e. As shown in FIG. 1e, through the via holes, one first connecting portion C connects the first conductive unit 11 and the second conductive unit 12, and another first connecting portion C connects the third conductive unit 13 and the fourth conductive unit 14. It should be noted that, the conductive units 11~14 are made of a first conductive material, and the first connecting portions C are made of a second conductive material different from the first conductive material. In addition, the conductive units 11~14 and the first connecting portions C are not configured at the same plane. Specifically speaking, the first connecting portions C are configured upon the conductive units 11~14, and one of them connects the first conductive unit 11 and the second conductive unit 12 through via holes and another of them connects the third conductive unit 13 and the fourth conductive unit 14 through via holes.

Compared with a shielding structure that is entirely configured at one plane (in other words, every conductive unit and each portion thereof is configured at one plane), the shielding structure 1 shown in FIG. 1e formed by connecting portions configured at one plane and conductive units configured at another plane is less likely to cause an Eddy current. Also, the connecting portion connects the conductive units through via holes. The resistance of via holes is large, which decreases the conductivity of the connected conductive units, and further reduces the current flowing among the conductive units and minimizes the Eddy current effect. Moreover, it is hard to precisely predict the flowing path of the induced current, so in this embodiment, the resistances of via holes and the connecting portions can be finely tuned to optimize the characteristics of the shielding structure.

Another Embodiment of the Shielding Structure

Figure 2A:
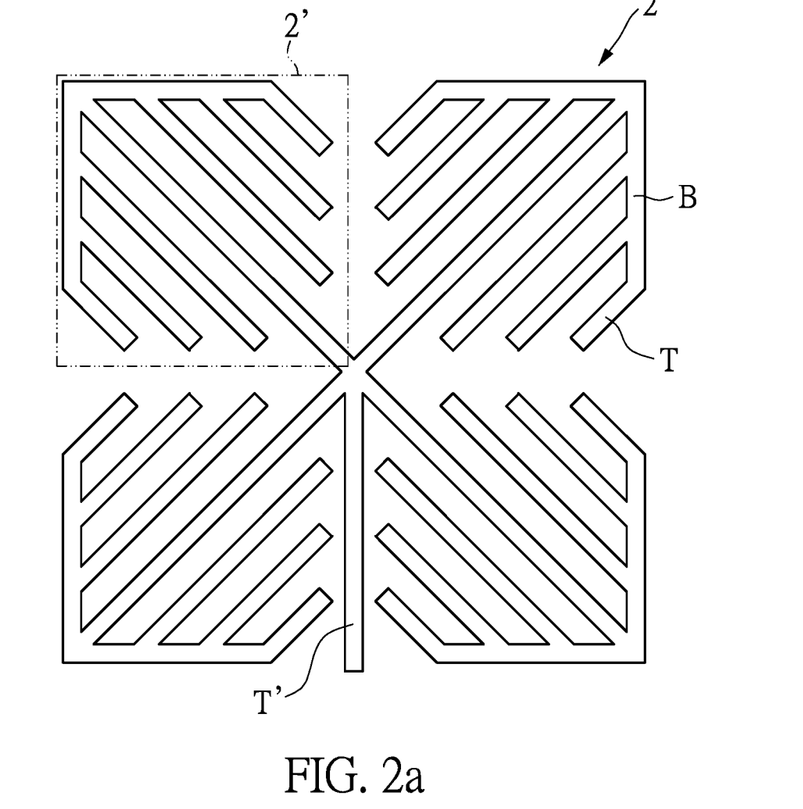
FIG. 2a shows a schematic diagram of a shielding structure for integrated inductors/transformers in still another embodiment of the present disclosure.
Figure 2B:
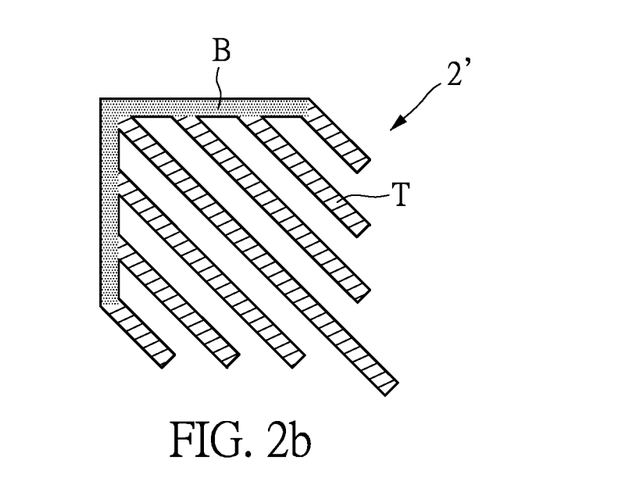

Referring to FIG. 2a and FIG. 2b, FIG. 2a shows a schematic diagram of a shielding structure for integrated inductors/transformers in still another embodiment of the present disclosure, and FIG. 2b shows a schematic diagram of a conductive unit of the shielding structure shown in FIG. 2a.

As shown in FIG. 2a, the shielding structure 2 comprises a plurality of conductive units 2' and a third conductive portion T'. One single conductive unit 2' is shown in FIG. 2b. The conductive unit 2b comprises a first conductive portion B and a plurality of second conductive portions T. As shown in FIG. 2b, the second conductive portions T extend from the first conductive portion B. The number of the second conductive portions T is odd, and the length of each second conductive portion T progressively diminishes from a center of the first conductive portion B to both of two ends of the first conductive portion B. In other words, each longest second conductive portion T extends from the center of each first conductive portion B, and two shortest second conductive portions T extend from two ends of each first conductive portion B. Also, the longest second conductive portions T of the conductive units 2' of the shielding structure 2 are connected together. Moreover, to be connected to a grounding portion G, there is a third conductive portion T' extending from where the longest second conductive portions T of the conductive units 2' are connected.

It is worth mentioning that, in this embodiment, the surrounding of the shielding structure 2 is not closed but has certain openings. Specifically speaking, the conductive units 2' are only connected by connecting the longest second conductive portion T of each conductive unit 2' together. Except for that, there is no other connection among the conductive units 2'. In this manner, the Eddy current effect can be reduced so as to prevent the reverse magnetic field formed by the induced current from damaging the integrated inductor/transformer. Thus, the characteristics of the integrated inductor/transformer can be effectively improved. In addition to the integrated inductor, the shielding structure 2 in this embodiment can be also used in a transformer having many coils, and it is not limited herein. Additionally, the shielding structure 2 shown in FIG. 2a is quadrangular, but the shape of the shielding structure 2 in this embodiment is not limited.

Figure 2C:
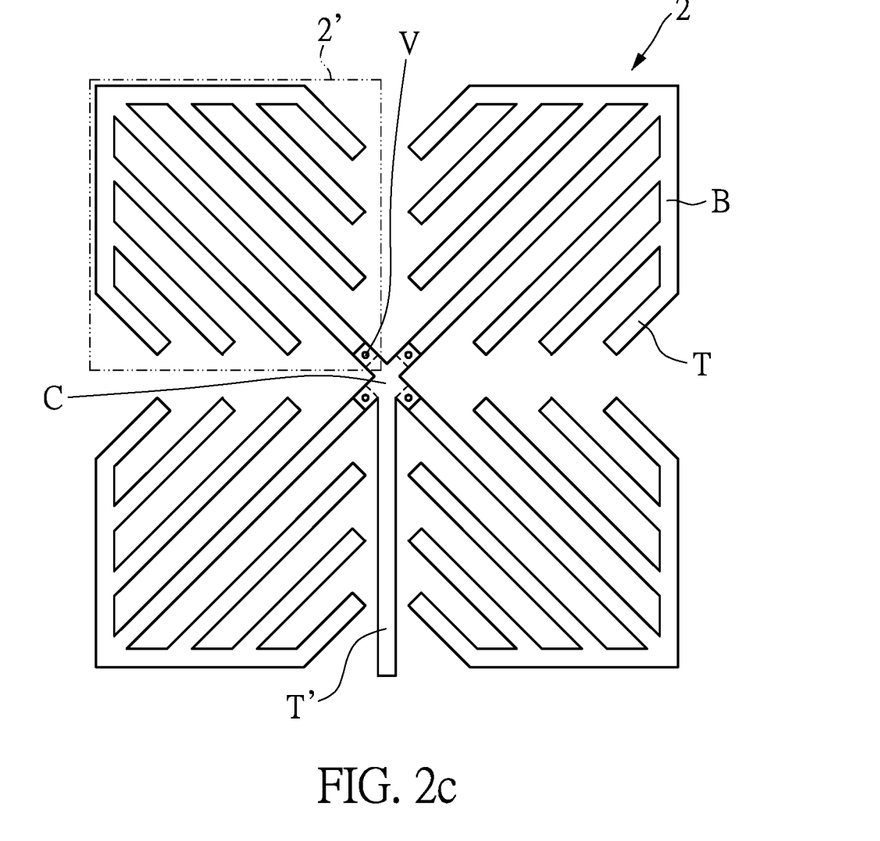
FIG. 2c shows a schematic diagram of a shielding structure for integrated inductors/transformers in still another embodiment of the present disclosure.

Referring to FIG. 2c, FIG. 2c shows a schematic diagram of a shielding structure for integrated inductors/transformers in still another embodiment of the present disclosure. The basic structures of the shielding structures 2 shown in FIG. 2a and FIG. 2c are similar but have a difference that, there are a first connecting portion C and a plurality of via holes in the shielding structure 2 shown in FIG. 2c.

As shown in FIG. 2c, the first connecting portion C is radial-shaped; more precisely, the first connecting portion C in this embodiment is in a cross shape because the shielding structure 2 shown in FIG. 2c is quadrangular, but it is not limited herein. The first connecting portion C connects the longest second conductive portion T of each conductive unit 2' through via holes V to form the shielding structure 2. The conductive units 2' are made of a first conductive material, and the first connecting portion C is made of a second conductive material different from the first conductive material. In addition, the conductive units 2' and the first connecting portion C are not configured at the same plane. Specifically speaking, the first connecting portion C is configured upon the conductive units 2', and connects the longest second conductive portion T of each conductive unit 2' through via holes V.

Compared with a shielding structure that is entirely configured at one plane, the shielding structure 2 shown in FIG. 2c formed by one connecting portion configured at one plane and conductive units configured at another plane is less likely to cause an Eddy current. Also, the connecting portion C connects the conductive units 2' through via holes. The resistance of via holes is large, which decreases the conductivity of the connected conductive units, and further reduces the current flowing among the conductive units and minimizes the Eddy current effect. Moreover, it is hard to precisely predict the flowing path of the induced current, so in this embodiment, the resistances of via holes and the connecting portion can be finely tuned to optimize the characteristics of the shielding structure.

Still Another Embodiment of the Shielding Structure

Figure 3A:
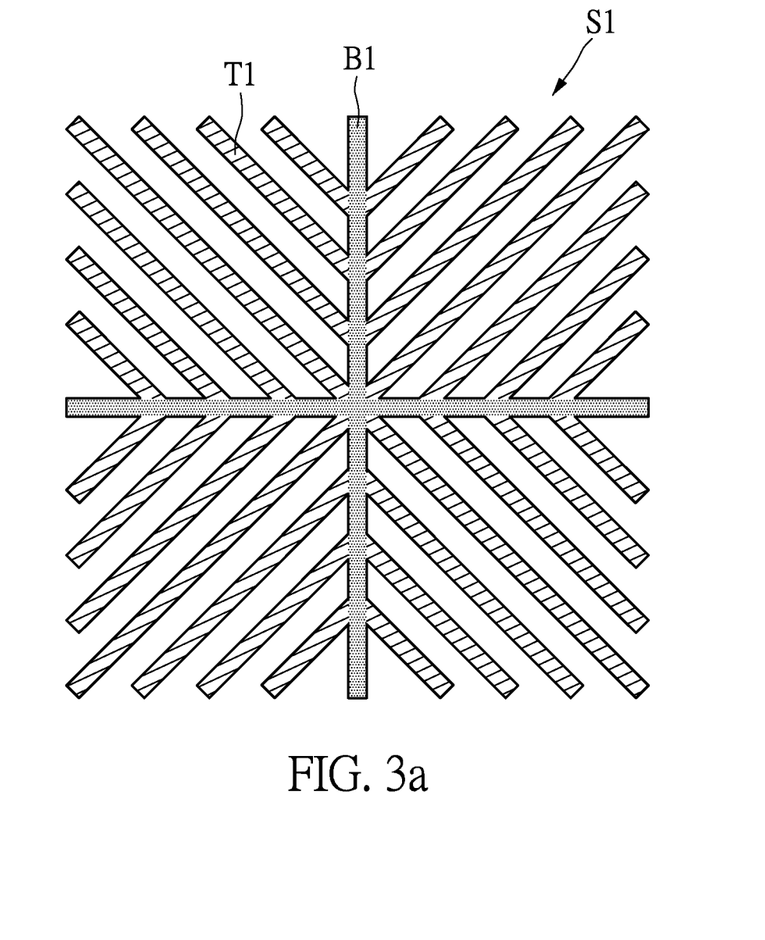
FIGS. 3a-3c show schematic diagrams of shielding structures for integrated inductors/transformers in other embodiments of the present disclosure.
Figure 3B:
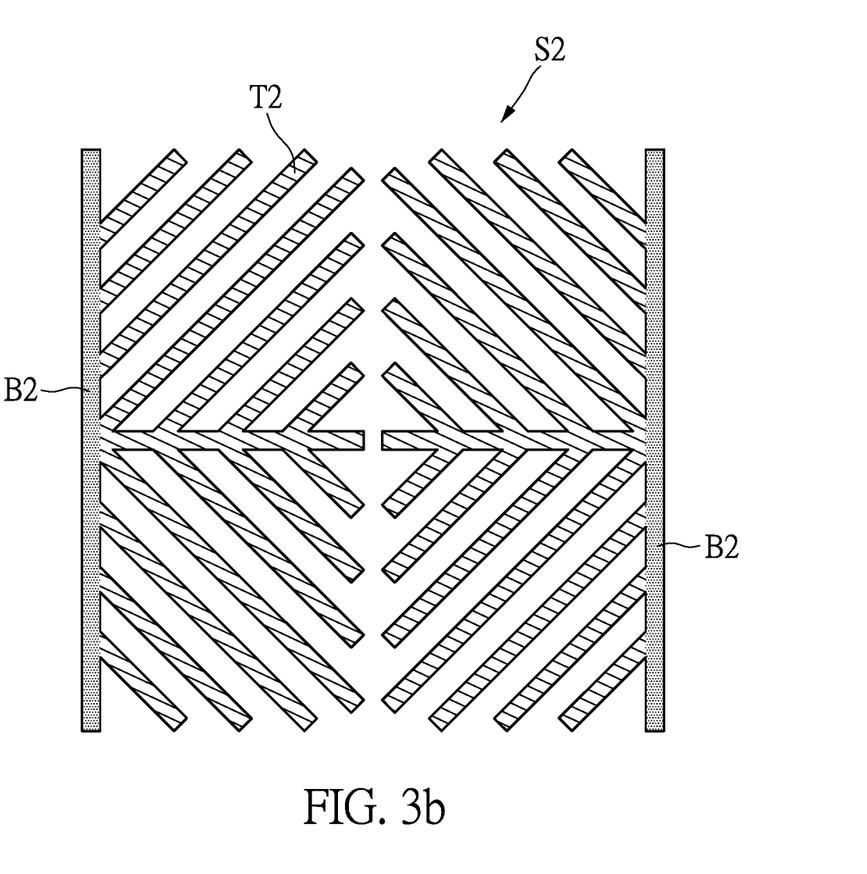
Figure 3C:
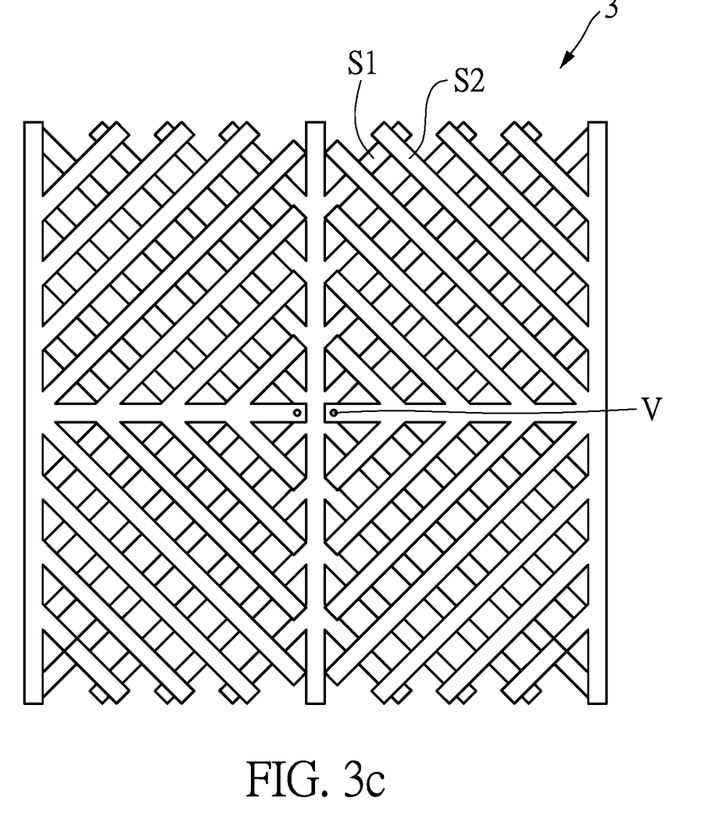

Referring to FIGS. 3a-3c, FIGS. 3a-3c show schematic diagrams of shielding structures for integrated inductors/transformers in other embodiments of the present disclosure. As shown in FIG. 3c, the shielding structure 3 comprises a first shielding layer S1, a second shielding layer S2 and a plurality of via holes V.

Specifically speaking, the shielding structure shown in FIG. 3a is the first shielding layer S1 of the shielding structure 3 shown in FIG. 3c. Referring to FIG. 3a, the first shielding layer S1 comprises a first conductive portion B1 and a plurality of second conductive portions T1. In the first shielding layer S1, the second conductive portions T1 extend radially from the first conductive portion B1. In addition, the second conductive portions T1 are parallel with each other. As shown in FIG. 3a, the first shielding layer S1 is fishbone-shaped.

On the other hand, the shielding structure shown in FIG. 3b is the second shielding layer S2 of the shielding structure 3 shown in FIG. 3c. Referring to FIG. 3b, the second shielding layer S2 comprises a first conductive portion B2 and a plurality of second conductive portions T2. In the second shielding layer S2, the second conductive portions T2 extend inwardly from the first conductive portion B2. In addition, the second conductive portions T2 are parallel with each other. Obviously, the shielding structure 3 shown in FIG. 3b can be formed by dividing the shielding structure 3 shown in FIG. 3a by its central axis O into two equal parts and turning one of them to become a mirror image of the other.

Again referring to FIG. 3c, the shielding structure 3 shown in FIG. 3c is formed by overlapping the first shielding layer S1 shown in FIG. 3a upon the second shielding layer S2 shown in FIG. 3b, and connecting them through a plurality of via holes V. As shown in FIG. 3c, each second conductive portion T1 of the first shielding layer S1 is perpendicular to the overlapped second conductive portions T2 of the second shielding layer S2. It is worth mentioning that, the via holes can be configured at anywhere the first shielding layer S1 and the second shielding layer S2 are overlapped, to connect the first shielding layer S1 and the second shielding layer S2 for forming the shield structure 3 shown in FIG. 3c.

In this manner, the magnetic fields generated by the first shielding layer S1 and the second shielding layer S2 will be opposite and thus mutually cancel each other, which prevents the induced current. It is worth mentioning that, compared with the shielding structures shown in FIG. 3a and FIG. 3b, the performance of the shielding structure 3 shown in FIG. 3c formed by overlapping the former two shielding structures is 2% to 5% better.

Figure 3D:
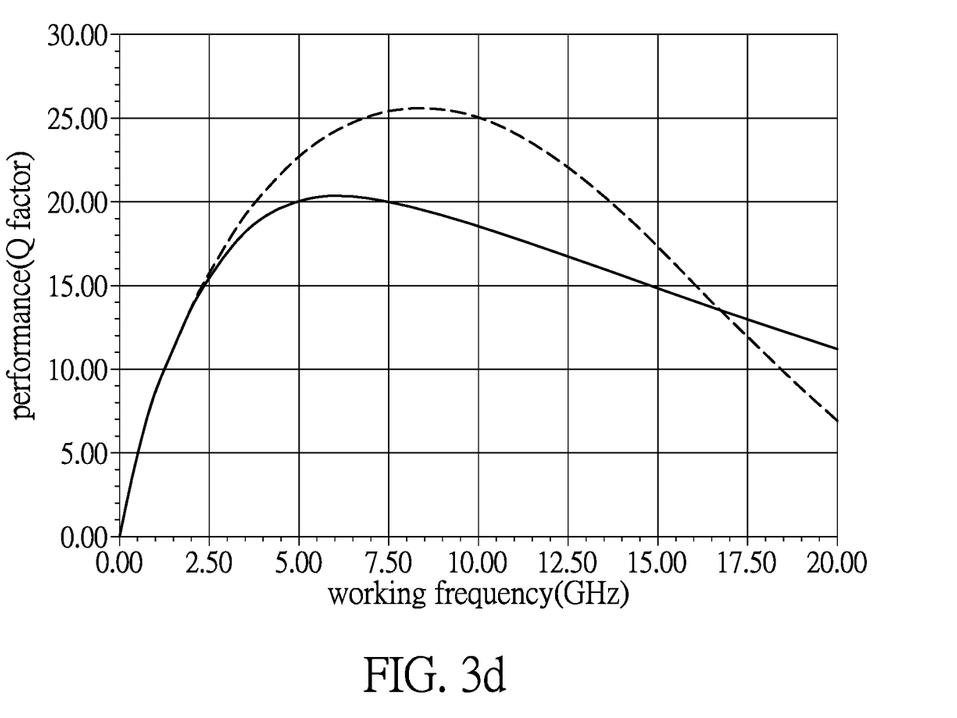
FIG. 3d shows a curve diagram showing the relationship between the working frequencies and the Q factors of the shielding structures shown in FIGS. 3a-3c.

In addition, the shielding structure 3 shown in FIG. 3c is a good fit for an 8-shaped inductor comprising two coil windings, but it is not limited herein. Moreover, the shielding structure 3 shown in FIG. 3c is formed by overlapping the second shielding layer S2 shown in FIG. 3b upon the first shielding layer S1 shown in FIG. 3a in the embodiment, but in another embodiment the shielding structure shown in FIG. 3c can be also formed by overlapping the first shielding layer S1 shown in FIG. 3a upon the second shielding layer S2 shown in FIG. 3b. Referring to FIG. 3d, FIG. 3d shows a curve diagram showing the relationship between the working frequencies and the performance (the Q factor) of the shielding structures shown in FIGS. 3a-3c. According to FIG. 3d, the shielding structure formed by only the first shielding layer S1 can have its best Q factor, 20%, when the working frequency is about 5 G Hz. On the other hand, the shielding structure formed by only the second shielding layer S2 can have its best Q factor, 25%, when the working frequency is about 10 G Hz. Thus, by overlapping the second shielding layer S2 upon the first shielding layer S1 or by overlapping the first shielding layer S1 upon the second shielding layer S2 to form a shielding structure, the best Q factor of the shielding structure can be roughly from 20% to 25%. Specifically speaking, the shielding structure 3 as shown in FIG. 3c formed by overlapping the second shielding layer S2 upon the first shielding layer S1 can have a better Q factor.

Furthermore, the shielding structure 3 shown in FIG. 3c is formed by overlapping two shielding layers, but the number of shielding layers for forming a shielding structure is not limited herein. However, overlapping more than two shielding layers to form a shielding structure might increase the parasitic capacitance effect, and the parasitic capacitance effect may contradict the improved performance of the shielding structure. Therefore, the number of shielding layers for forming a shielding structure can be designed depending on needs.

To sum up, in the shielding structures for integrated inductors/transformers disclosed by the present disclosure, the surrounding of the shielding structure is not closed but has openings, and the center of the shielding structure is not hollow because conductive units are connected at the center of the shielding structure. In this manner, the Eddy current effect can be reduced so as to prevent the reverse magnetic field formed by the induced current from damaging the integrated inductor/transformer. Thus, the characteristics of the integrated inductor/transformer can be effectively improved. In addition, the conductive units are connected through via holes. The resistance of via holes is large, such that the conductivity of the connected conductive units decreases, which reduces the current flowing among the conductive units and minimizes the Eddy current effect. Moreover, the resistances of via holes and the connecting portions can be finely tuned to optimize the characteristics of the shielding structure. Additionally, the multi-layer design of the shielding structure can effectively make the performance better.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A shielding structure for integrated inductor/transformer, used in an inductor or a transformer, configured under the inductor or the transformer and upon a substrate, comprising:

a plurality of conductive units, comprising a first conductive unit, a second conductive unit, a third conductive unit and a fourth conductive unit, each conductive unit comprising a first conductive sub-unit and a second conductive sub-unit, both of the first conductive sub-unit and the second conductive sub-unit comprising a first conductive portion and a plurality of second conductive portions extending from the first conductive portion, the number of the second conductive portions being odd, the length of each second conductive portion progressively diminishing along the first conductive portion, wherein the longest second conductive portion of the first conductive sub-unit and the longest second conductive portion of the second conductive sub-unit are connected;
a plurality of first connecting portions, configured to connect the first conductive unit and the second conductive unit and to connect the third conductive unit and the fourth conductive unit; and
a grounding portion;
wherein the first conductive portion of the first conductive sub-unit of the first conductive unit is connected to the first conductive portion of the second conductive sub-unit of the fourth conductive unit and the grounding portion is connected to where these two first conductive portions are connected, or the first conductive portion of the second conductive sub-unit of the second conductive unit is connected to the first conductive portion of the first conductive sub-unit of the third conductive unit and the grounding portion is connected to where these two first conductive portions are connected.

2. The shielding structure for integrated inductor/transformer according to claim 1, further comprising:
a plurality of via holes, one of the first connecting portions connecting the first conductive unit and the second conductive unit, and another one of the first connecting portions connecting the third conductive unit and the fourth conductive unit through the via holes.

3. The shielding structure for integrated inductor/transformer according to claim 1, wherein the conductive units are made of a first conductive material and the first connecting portions are made of a second conductive material different the first conductive material.

4. A shielding structure for integrated inductor/transformer, used in an inductor or a transformer, configured under the inductor or the transformer and upon a substrate, comprising:
a plurality of conductive units, each conductive unit comprising a first conductive portion and a plurality of second conductive portions, the second conductive portions extending from the first conductive portion, the number of the second conductive portions being odd, the length of each second conductive portion progressively diminishing from a center of the first conductive portion to both of two ends of the first conductive portion, wherein the longest second conductive portions of the conductive units are connected; and
a third conductive portion, extending from where the longest second conductive portions of the conductive units are connected, to be connected to a grounding portion.

5. The shielding structure for integrated inductor/transformer according to claim 4, further comprising:
a first connecting portion, being radial-shaped;
the third conductive portion, having one end connected to the first connecting portion and another end connected to the grounding portion; and
a plurality of via holes, the first connecting portion connecting the longest second conductive portions through the via holes to form the shielding structure.

6. The shielding structure for integrated inductor/transformer according to claim 5, wherein the conductive units are made of a first conductive material, and the first connecting portion and the third conductive portion are made of a second conductive material different from the first conductive material.

7. A shielding structure for integrated inductor/transformer, used in an inductor or a transformer, configured under the inductor or the transformer and upon a substrate, comprising:
a first shielding layer, a second shielding layer and a plurality of via holes, the second shielding layer and the first shielding layer overlapped and connected through the via holes to form the shielding structure;
wherein the first shielding layer comprises:
a first conductive portion; and
a plurality of second conductive portions, extending radially from the first conductive portion of the first shielding layer, wherein the second conductive portions of the first shielding layer are parallel with each other;
wherein the second shielding layer comprises:
a first conductive portion; and
a plurality of second conductive portions, extending inwardly from the first conductive portion of the second shielding layer, wherein the second conductive portions of the second shielding layer are parallel with each other;
wherein each second conductive portion of the first shielding layer is perpendicular to the overlapped second conductive portions of the second shielding layer.

8. The shielding structure for integrated inductor/transformer according to claim 7, wherein the first shielding layer is made of a first conductive material and the second shielding layer is made of a second conductive material different from the first conductive material.

9. The shielding structure for integrated inductor/transformer according to claim 7, wherein the first shielding layer is configured under the second shielding layer, or the first shielding layer is configured upon the second shielding layer.

10. The shielding structure for integrated inductor/transformer according to claim 7, wherein the first shielding layer is configured under the second shielding layer.

* * * * *